(12) United States Patent
Ikuta et al.

(10) Patent No.: US 7,238,987 B2
(45) Date of Patent: Jul. 3, 2007

(54) LATERAL SEMICONDUCTOR DEVICE AND METHOD FOR PRODUCING THE SAME

(75) Inventors: Teruhisa Ikuta, Ikoma (JP); Hiroyoshi Ogura, Kyoto (JP); Yoshinobu Sato, Takatsuki (JP); Hisao Ichijo, Soraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 11/242,084

(22) Filed: Oct. 4, 2005

(65) Prior Publication Data

US 2006/0118902 A1 Jun. 8, 2006

(30) Foreign Application Priority Data

Dec. 6, 2004 (JP) .............................. 2004-352350

(51) Int. Cl.
*H01L 29/76* (2006.01)
*H01L 21/84* (2006.01)
(52) U.S. Cl. .................. 257/343; 257/409; 257/491; 257/E29.261; 438/149; 438/163
(58) Field of Classification Search ................ 257/327, 257/343, 409, 491–493, E29.261; 438/149, 438/163, 335, 517
See application file for complete search history.

(56) References Cited

U.S. PATENT DOCUMENTS

| | | | |
|---|---|---|---|
| 5,382,535 A * | 1/1995 | Malhi et al. ................. 438/194 |
| 5,637,909 A * | 6/1997 | Nakajima et al. ............ 257/559 |
| 5,998,845 A | 12/1999 | Ludikhuize |
| 6,043,114 A * | 3/2000 | Kawagoe et al. ........... 438/197 |
| 6,107,127 A * | 8/2000 | Kocon ........................ 438/217 |
| 6,441,432 B1 | 8/2002 | Sumida |
| 6,853,034 B2 * | 2/2005 | Matsuzaki et al. .......... 257/343 |

FOREIGN PATENT DOCUMENTS

| | | |
|---|---|---|
| JP | 2000505955 | 5/2000 |
| JP | 2000156495 | 6/2000 |
| JP | 2000216393 | 8/2000 |
| WO | 9828796 | 7/1998 |

* cited by examiner

*Primary Examiner*—T. N. Quach
(74) *Attorney, Agent, or Firm*—Stevens, Davis, Miller & Mosher, LLP

(57) ABSTRACT

A high withstand voltage lateral semiconductor device capable of improving its on-state breakdown voltage and safe operation area (SOA) without lowering its current capabilities, and structured so as to be easy to produce. The lateral semiconductor device comprises a second conductivity type second semiconductor region formed in a semiconductor layer so as to be adjacent to or away from a first semiconductor region, a second conductivity type source region, a second conductivity type drain region, and a gate electrode formed on a gate insulating film formed between an end of the source region on the surface of the semiconductor layer and an end of the second semiconductor region, wherein the first semiconductor region is extended from under the source region to partly under the gate electrode, the concentration distribution of a first conductivity type impurity increases in the region ranging from the surface of the semiconductor layer to the embedded insulating film and has a peak under the source region, and the impurity concentration in the semiconductor layer ranging from directly under the first semiconductor region to the embedded insulating film is lower than the surface concentration in the first semiconductor region.

19 Claims, 11 Drawing Sheets

LATERAL SEMICONDUCTOR DEVICE AND METHOD FOR PRODUCING THE SAME

BACKGROUND OF THE INVENTION

1. Field of the Invention

The present invention relates to a lateral semiconductor device formed on an SOI substrate and a method for producing the same.

2. Prior Art

In recent years, products, each comprising high withstand voltage lateral semiconductor devices formed on a silicon-on-insulator (SOI) substrate and low withstand voltage circuits and being integrated on a single chip, have been developed for use in color PDPs.

For the purpose of reducing the area of a high withstand voltage lateral MOS transistor device, it is necessary to improve its current capabilities (ON-resistance and drain saturation current) while maintaining its target withstand voltage.

In addition, it has become important to raise the on-state breakdown voltage of the device, that is, to improve the safe operation area (SOA), and to improve the ESD resistance of the device. Furthermore, the structure of the device has been studied (Patent Publication No. 3473460 and Tokuhyo No. 2000-505955). For example, raising impurity concentration in the region between the source region and the buried insulating film of a device, described in Japanese Laid-open Patent Application No. 2000-216393, has been proposed as a method for the improvement. FIG. 11 is a sectional view showing the structure of the device.

An N-type semiconductor layer 3 is bonded onto a support substrate 1 isolated by a buried insulating film 2. In the N-type semiconductor layer 3, a P-well region 5, an $N^+$-source region 6, an $N^+$-drain region 4 and a $P^+$-contact diffusion region 7 are diffused. Above the P-well region 5, a gate electrode 9 is formed on a gate insulating film 8 and extended to the upper side of a field oxide film 13. A P-type buried region 12 having a low resistance is inserted between the $N^+$-source region 6 and the buried insulating film 2. On the $N^+$-source region 6 and the $P^+$-contact diffusion region 7, a source electrode 10 is formed, and on the $N^+$-drain region 4, a drain electrode 11 is formed.

When the device is on-state and as its drain voltage is raised, the device is saturated and its drain current becomes constant. When the drain voltage is raised further, avalanche breakdown occurs on the drain side owing to the Kirk effect. The hole current thus generated flows to the P-type buried region 12 directly under the $N^+$-source region 6. This current causes a voltage drop directly under the $N^+$-source region 6, and the voltage of the P-type buried region 12 rises. When the voltage rises higher than the source voltage and becomes the built-in potential or more, the turn-on of a parasitic bipolar transistor comprising the $N^+$-source region 6, the P-type buried region 12 and the $N^+$-drain region 4 is occurred. At the turn-on of parasitic bipolar transistor, the snap-back phenomenon occurs, large current flows, thereby causing breakdown. Hence, for the purpose of raising the breakdown voltage and expanding the SOA, it is important to suppress the turn-on of the parasitic bipolar transistor and the Kirk effect.

Since the P-type buried region 12 having high impurity concentration is inserted between the $N^+$-source region 6 and the embedded insulating film 2, the parasitic resistance under the $N^+$-source region 6 is reduced, and a voltage drop is also reduced. With this configuration, the voltage at the turn-on of the parasitic bipolar transistor can be raised, and the SOA can be improved.

The device structure disclosed in Japanese Laid-open Patent Application No. 2000-216393, the prior art, has two problems described below.

A first problem is that, when the withstand voltage of an NMOS transistor in particular is raised to 100 V or more, its on-state breakdown voltage is insufficient.

In the case that the impurity concentration in the P-well region is low, when the drain voltage is raised, the expansion of the depletion region to the P-well region increases. Hence, if the interval between the $N^+$-source region and the N-type semiconductor layer (drift region) is small, the depletion region reaches the $N^+$-source region, and punch-through occurs, and the off-state breakdown voltage lowers. Furthermore, with respect to the on-state breakdown voltage, the depletion region expands to the P-well region, and Vth is apt to lower owing to the short channel effect. As a result, the drain saturation current increases, and the on-state breakdown voltage lowers.

On the other hand, in the case that the impurity concentration in the P-well region is high, Vth rises, the ON-resistance increases, and the drain saturation current lowers. As a result, the on-state breakdown voltage is raised. However, since the current capabilities are lowered, the area of the device increases.

A second problem occurs in the case of a PMOS transistor in particular.

For the purpose of suppressing the turn-on of the parasitic bipolar transistor to raise the on-state breakdown voltage, it is effective to reduce the parasitic resistance by raising the impurity concentration in the buried layer.

As practical production methods for forming a buried layer having high impurity concentration, two methods are available: the high-energy ion implantation method and the epitaxial growth method.

However, since the buried region of the PMOS transistor is an N-type, there are three kinds of impurities: phosphorus, arsenic and antimony. In comparison with the range Rp of boron in an NMOS transistor, the ranges Rp of these impurities are small. If ion implantation is carried out under a high-dose condition, ion implantation time per wafer becomes long, and productivity is lowered. Hence, in reality, it is frequently difficult to carry out high-dose ion implantation.

For this reason, in the case of the PMOS transistor, a production means for easily forming a buried layer having high impurity concentration is to bury a diffusion layer using epitaxial growth.

However, since the buried diffusion layer is formed first by diffusion processing, its heat treatment time becomes long in comparison with the heat treatment time for the other diffusion layers. Hence, if a buried layer having high impurity concentration is formed under the gate electrode to prevent punch-through between the source and the drain, in the case that the other diffusion layers, such as the well region, are subjected to necessary heat treatment, the N-type impurity is diffused to the channel region, and Vth of the PMOS transistor rises. Hence, there is concern that the drain saturation current lowers. After all, although the on-state breakdown voltage is raised, there is a problem of lowering the drain saturation current.

GENERAL DESCRIPTION OF THE INVENTION

The present invention is intended to provide a lateral semiconductor device capable of improving its on-state breakdown voltage and its safe operation area without lowering the current capabilities of the high withstand voltage lateral semiconductor device, and to provide a method for producing the same.

The present invention provides a lateral semiconductor device having a structure capable of solving the above-mentioned two problems. First, a device structure capable of solving the first problem will be described below.

A lateral semiconductor device in accordance with a first invention comprises a support substrate, a buried insulating film formed on the support substrate, a first conductivity type semiconductor layer formed on the buried insulating film, a first conductivity type first semiconductor region formed on the surface of the semiconductor layer, a second conductivity type second semiconductor region formed in the semiconductor layer so as to be adjacent to or away from the first semiconductor region, a second conductivity type source region formed on the surface of the first semiconductor region, a second conductivity type drain region formed on the surface of the second semiconductor region, a gate insulating film formed between an end of the source region on the surface of the semiconductor layer and an end of the second semiconductor region, and a gate electrode formed on the gate insulating film, wherein the first semiconductor region is extended from under the source region to partly under the gate electrode, the concentration distribution of a first conductivity type impurity increases in the region ranging from the surface of the semiconductor layer to the embedded insulating film and has a peak under the source region, and the impurity concentration in the semiconductor layer ranging from directly under the first semiconductor region to the embedded insulating film is lower than the surface concentration in the first semiconductor region.

With this configuration, in the first semiconductor region, the vertical concentration distribution of the first conductivity type impurity increases in the region ranging from the surface of the semiconductor layer to the buried insulating film and has a retrograde profile having a peak under the source region. Hence, the parasitic resistance of the semiconductor layer under the source region can be reduced, whereby the turn-on of the parasitic bipolar transistor can be suppressed, and the on-state breakdown voltage can be improved.

In addition, the first semiconductor region is extended toward the drain side from under the source region to partly under the gate electrode. Hence, even if a depletion region is extended toward the source in the case that the voltage of the drain rises, the first semiconductor region is effective in suppressing the reduction of Vth owing to punch-through between the source and drain and owing to the short channel effect.

Furthermore, since the dopant impurity has reached the surface, the region can also function as a Vt control layer. The channel resistance is reduced by relatively lowering the impurity concentration in the channel region and by shortening the overlap length of the gate electrode and the first semiconductor region. Hence, the reduction of the drain saturation current can be suppressed.

Still further, the first semiconductor region is frequently formed on the upper side of the semiconductor layer. The N-type or the P-type can be selected arbitrarily as the conductivity type of the semiconductor layer between the first semiconductor region and the buried insulating film. In the present invention, the conductivity type is made identical with that of the first semiconductor region.

With this configuration, the off-state breakdown voltage can be raised. The reason why the off-state breakdown voltage is raised is described below.

The case that the semiconductor layer ranging from the first semiconductor region to the buried insulating film is a conductivity type opposite the conductivity type of the first semiconductor region, unlike the case of the present invention, will be studied as described below. When a reverse bias is applied between the first semiconductor region and the second semiconductor region, the depletion region is also extended to the semiconductor layer under the first semiconductor region. Until the depletion region reaches the buried insulating film, the extension of the depletion region ranging from the buried insulating film to the second semiconductor region is suppressed. This lowers the effect of reducing the surface field (RESURF) and lowers the off-state breakdown voltage.

The impurity concentration in the semiconductor layer should be set so as to be lower than the surface concentration in the first semiconductor region. If the impurity concentration becomes higher than the surface concentration, the channel resistance is affected, and the drain saturation current is lowered.

A lateral semiconductor device in accordance with a second invention comprises a support substrate, a buried insulating film formed on the support substrate, a second conductivity type semiconductor layer formed on the buried insulating film, a first conductivity type well region formed so as to reach the buried insulating film from the surface of the semiconductor layer, a first conductivity type first semiconductor region formed on the surface of the well region, a second conductivity type source region formed on the surface of the first semiconductor region, a second conductivity type drain region formed on the surface of the semiconductor layer so as to be away from the well region, a gate insulating film formed between an end of the source region on the surface of the semiconductor layer and an end of the well region, and a gate electrode formed on the gate insulating film, wherein the first semiconductor region is extended from under the source region to partly under the gate electrode, the concentration distribution of a first conductivity type impurity increases in the region ranging from the surface of the semiconductor layer to the embedded insulating film and has a peak under the source region, and the impurity concentration in the well region ranging from directly under the first semiconductor region to the embedded insulating film is lower than the surface concentration in the first semiconductor region.

With this configuration, in the case that the semiconductor layer of a conductivity type opposite that of the first invention is used on the support substrate, a similar effect can be obtained by adding a p-well region reaching the buried insulating film.

A lateral semiconductor device in accordance with a third or fourth invention is a lateral semiconductor device in accordance with the first or second invention, wherein an interval is provided between an end of the first semiconductor region and an end of the second semiconductor region.

Since the first semiconductor region is formed on the upper side of the semiconductor layer so as to have a relatively small depth, the curvature radius of the end portion of the diffusion layer is small. Hence, when the depletion region is extended to the end portion, the electric field is apt to be concentrated. With the above-mentioned configuration, the first conductivity type semiconductor layer having a low impurity concentration is disposed between the first semiconductor region and the second semiconductor region, and the off-state breakdown voltage is raised.

In addition, the depletion region extended to the second semiconductor region serving as the drain region becomes small, and the reduction of the drain saturation current can be made small.

A lateral semiconductor device in accordance with a fifth or sixth invention is a lateral semiconductor device in accordance with the first or second invention, wherein the peak of the concentration distribution of the first conductivity type impurity in the first semiconductor region is located at a depth of 0.5 µm or less from the surface of the semiconductor layer.

With this configuration, in the case that the impurity is boron, the acceleration energy can be reduced to 180 KeV. It is thus not necessary to carry out ion implantation at a high energy of several hundred KeV to 1 MeV. Hence, it is not necessary to thicken a resist mask to prevent ion penetration. Furthermore, even if a relatively high dose is implanted, the time for wafer treatment is shortened, and productivity is not lowered.

A lateral semiconductor device in accordance with a seventh or eighth invention is a lateral semiconductor device in accordance with the first or second invention, wherein the surface concentration of the first conductivity type impurity in the first semiconductor region is in the range of 5 to 20% of the peak concentration.

This configuration provides a device structure wherein the concentration profile in the vicinity of the surface is made moderate, and the variation of Vth is reduced. If the impurity concentration distribution in the vicinity of the surface becomes steep, the influence of variations in the retrograde profile becomes significant. On the other hand, if the impurity concentration distribution in the vicinity of the surface becomes too moderate, the use of the retrograde profile becomes meaningless. The impurity concentration distribution in the vicinity of the surface can be made relatively moderate and the variations in Vth can be reduced by setting the surface concentration so as to be smaller than the surface concentration by nearly one order of magnitude, that is, 5 to 20%.

A lateral semiconductor device in accordance with a ninth or tenth invention is a lateral semiconductor device in accordance with the first or second invention, wherein a first conductivity type buried region having an impurity concentration higher than that in the semiconductor layer is provided in the semiconductor layer under the first semiconductor region.

This configuration provides a device structure for further improving the on-state breakdown voltage and the SOA. The buried region having a high concentration can be formed relatively easily by using epitaxial growth. Since the parasitic resistance of the well region under the source region can be reduced, the effect of suppressing the turn-on of the parasitic bipolar transistor can be enhanced.

A lateral semiconductor device in accordance with an 11th or 12th invention is a lateral semiconductor device in accordance with the first or second invention, wherein the overlap length of the first semiconductor region and the gate electrode is nearly equal to the depth of the peak of the concentration distribution of the first conductivity type impurity from the surface of the semiconductor layer.

Since the surface concentration in the first semiconductor region is higher than that in the semiconductor layer, the channel resistance is almost determined by the overlap length of the first semiconductor region and the gate electrode. Hence, the increase in the channel resistance can be reduced and the reduction of the drain saturation current can be suppressed by making this length as short as possible, even if the impurity concentration in the first semiconductor region is raised. As the impurity concentration in the first semiconductor region is higher, the turn-on of the parasitic bipolar transistor can be suppressed more effectively. It is thus possible to improve both the drain saturation current and the on-state breakdown voltage.

However, if the overlap length of the first semiconductor region and the gate electrode is made too short, the withstand voltage lowers owing to punch-through between the source and the drain, and channel resistance modulation, such as a short channel effect, occurs. As a result, the drain saturation current increases, and the on-state breakdown voltage is not raised but lowered. For the purpose of preventing the above-mentioned problem, it is considered that the minimum overlap length of the first semiconductor region and the gate electrode is the depth of the peak of the concentration distribution of the first conductivity type from the surface of Si.

The dopant is diffused to at least the surface of the first semiconductor region, and the diffusion of a similar extent is also carried out in the lateral direction. Hence, the minimum overlap length is approximately similar to the range of the lateral diffusion, that is, the depth of the peak of the impurity concentration distribution from the surface of the semiconductor layer. This is nearly equal to the range Rp at the time of ion implantation.

Next, a device structure for the purpose of solving the second problem will be described below.

A lateral semiconductor device in accordance with a 13th invention comprises a support substrate, a buried insulating film formed on the support substrate, a first conductivity type semiconductor layer formed on the buried insulating film, a second conductivity type well region formed on the surface of the semiconductor layer, a first conductivity type second semiconductor region formed so as to be adjacent to or away from the well region in the semiconductor layer, a first conductivity type source region formed on the surface of the well region, a first conductivity type drain region formed on the surface of the second semiconductor region, a gate insulating film formed between an end of the source region and an end of the well region, and a gate electrode formed on the gate insulating film, wherein a second conductivity type buried region is provided in the semiconductor layer under the source region, and the diffusion constant of the second conductivity type impurity in the buried region is smaller than the diffusion constant of the second conductivity type impurity in the well region.

With this configuration, the concentration in the buried diffusion region formed under the source region in the well region can be raised easily without raising the surface concentration. Hence, the parasitic resistance of the well region is reduced without lowering the drain saturation current, whereby the turn-on of the parasitic bipolar transistor can be suppressed, and excellent on-state breakdown voltage can be obtained. Furthermore, even in the buried diffusion region before epitaxial growth, since the diffusion constant of the impurity is small, the impurity is not diffused to the channel region near the surface even if the other diffusion layers are heat-treated. For this reason, the concentration can be made sufficiently high.

A lateral semiconductor device in accordance with a 14th invention comprises a support substrate, a buried insulating film formed on the support substrate, a second conductivity type semiconductor layer formed on the buried insulating film, a second conductivity type well region formed on the surface of the semiconductor layer, a first conductivity type second semiconductor region formed so as to be adjacent to or away from the well region in the semiconductor layer, a first conductivity type source region formed on the surface of the well region, a first conductivity type drain region formed on the surface of the second semiconductor region, a gate insulating film formed between an end of the source region and an end of the second semiconductor region, and a gate electrode formed on the gate insulating film, wherein a second conductivity type buried region is provided in the semiconductor layer under the source region, and the diffusion constant of the second conductivity type impurity in the buried region is smaller than the diffusion constant of the second conductivity type impurity in the well region.

With this configuration, in the case that the semiconductor layer of a conductivity type opposite that of the 13th invention is used on the support substrate, a similar effect can be obtained.

A lateral semiconductor device in accordance with a 15th or 16th invention is a lateral semiconductor device in accordance with the 13th or 14th invention, wherein the buried region is extended from under the source region to the drain side.

A lateral semiconductor device in accordance with a 17th or 18th invention is a lateral semiconductor device in accordance with the 13th or 14th invention, wherein the impurity in the buried region is antimony or arsenic, and the impurity in the well region is phosphorus.

A lateral semiconductor device producing method in accordance with the 19th invention comprises a step of forming a mask layer on a first or second conductivity type semiconductor layer formed above a support substrate on a buried insulating film, a step of forming a buried region in the semiconductor layer by carrying out ion implantation of the second conductivity type first impurity using the mask layer as a mask, a step of carrying out ion implantation of a second impurity having a diffusion constant larger than that of the first impurity using the mask layer as a mask, a step of eliminating the mask layer and carrying out epitaxial growth on the surface of the semiconductor layer, and a step of forming a well region by extending the second impurity to the surface of the semiconductor layer by heat treatment.

With this configuration, in the method for producing the well region and the buried region, diffusion is carried out for the same mask using two kinds of impurities having different diffusion constants. Hence, this configuration provides a method for suppressing the increase in the number of masks.

As described above, the concentration in the buried region can be raised easily by forming a buried diffusion region having an impurity having a small diffusion constant in the well region. Hence, the parasitic resistance of the semiconductor layer under the source region can be reduced, and the turn-on of the parasitic bipolar transistor can be suppressed. Furthermore, in the present invention, the buried region and the well region having high concentrations can also be formed by using a self-aligned technology wherein two kinds of impurities having different diffusion constants are diffused for the same mask. Hence, the same mask can be used commonly for the well region and the buried insulating film, whereby cost increase due to the increase in the number of masks can be suppressed.

All the device structures in accordance with the present invention have an effect capable of improving the on and off-state breakdown voltage and the SOA without lowering the drain current. Furthermore, the device structures use production step conditions being carried out easily in production, thereby being excellent in not lowering the efficiency of production.

DESCRIPTION OF PREFERRED EMBODIMENTS

A first embodiment in accordance with the present invention will be described on the basis of FIGS. 1 to 3.

Figure 1:
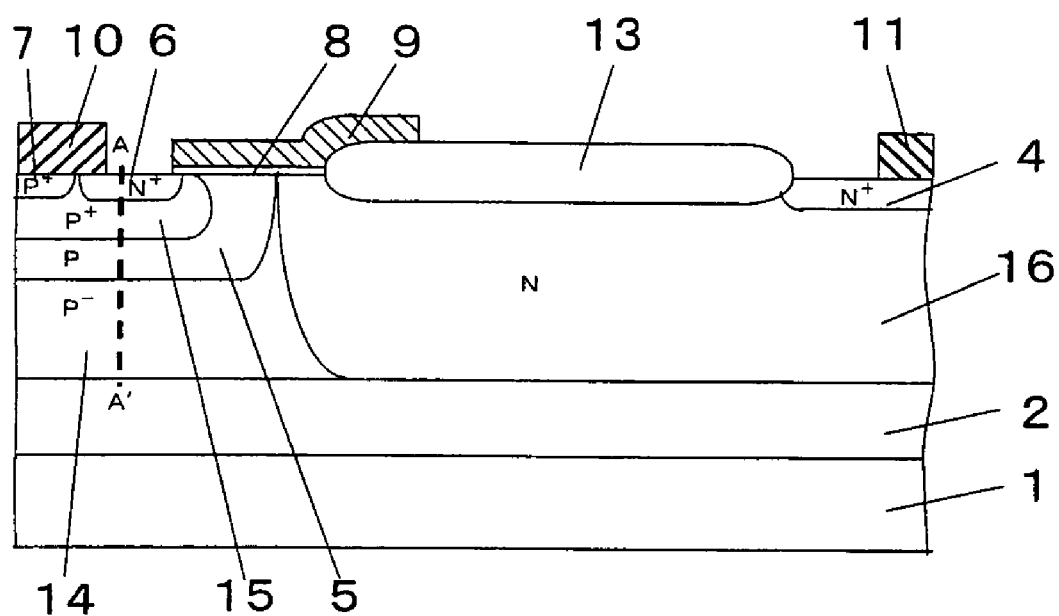
FIG. 1 is a sectional view of a high withstand voltage NMOS transistor in accordance with a first embodiment of the present invention.

FIG. 1 is a sectional view of a high withstand voltage NMOS transistor in accordance with the first embodiment of the present invention.

As shown in FIG. 1, above a support substrate 1, a $P^-$-semiconductor layer 14 having a thickness of 3.5 μm is formed on a buried insulating film 2 having a thickness of 1.5 μm. On the surface of the semiconductor layer 14, a P-type first semiconductor region 15, a P-well region 5 and an N-type second semiconductor region 16 away from the P-type first semiconductor region 15 are formed. This P-well region 5 is frequently commonly used with the P-well region of a low withstand voltage NMOS transistor or the P-offset region of a high withstand voltage PMOS transistor being integrated in the same chip, and its surface concentration is a relatively low concentration of approximately $1 \times 10^{16}$ $cm^{-3}$. In addition, on the surface of the first semiconductor region 15, an $N^+$-source region 6 is formed, and on the surface of the second semiconductor region 16, an $N^+$-drain region 4 is formed. Above the region between an end of the $N^+$-source region 6 on the surface of the $P^-$-semiconductor layer 14 and an end of the second semiconductor region 16, a gate electrode 9 is formed on a gate insulating film 8. The first semiconductor region 15 is extended approximately 1 µm from under the N+-source region 6 to partly under the gate electrode 9. Furthermore, the concentration distribution of the P-type impurity increases in the region ranging from the surface of the P−-semiconductor layer 14 to the embedded insulating film 2 and has a peak under the N+-source region 6. The impurity concentration in the P−-semiconductor layer 14 from directly under the first semiconductor region 15 to the embedded insulating film 2 is lower than the surface concentration in the first semiconductor region 15.

Figure 2:
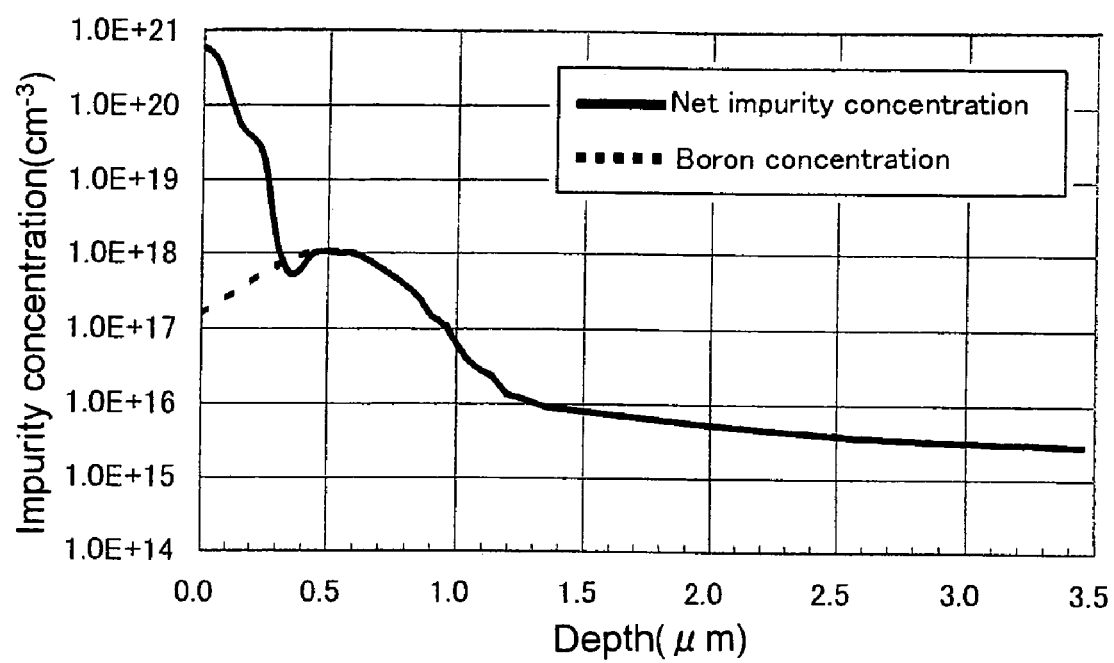
FIG. 2 shows an impurity profile in the vertical direction in the source region in accordance with the first embodiment of the present invention.

FIG. 2 shows the impurity concentration distribution on line A-A' of FIG. 1.

The depth of the PN junction between the N+-source region 6 and the P-type first semiconductor region 15 is in the range of 0.2 to 0.3 µm. The peak of the P-type impurity concentration distribution is approximately $1 \times 10^{18}$ cm$^{-3}$ and located nearly directly under the N+-source region 6 at a depth of 0.5 µm from the surface. The concentration of boron lowers relatively gradually in the direction from the N+-source region 6 to the surface, and boron reaches the surface. The surface concentration is approximately $2 \times 10^{17}$ cm$^{-3}$. This kind of retrograde profile can be formed easily by carrying out ion implantation at a boron dose of $6 \times 10^{13}$ ions/cm$^2$ and an acceleration energy of approximately 180 KeV and by carrying out appropriate drive-in. When the peak of the retrograde profile is located at a depth of 0.5 µm or less from the surface, the acceleration energy can be reduced to a relatively low value. Hence, even if a relatively high dose is implanted, the time for wafer treatment is shortened, and productivity is not lowered.

The boron concentration in the P−-semiconductor layer 14 in the region ranging from the P-type first semiconductor region 15 to the buried insulating film 2 is $1 \times 10^{16}$ cm$^{-3}$ or less, and is smaller than the surface concentration by an order of magnitude or less.

In the region having an interval of 1 µm between an end portion of the first semiconductor region 15 and the N+-drain region 4, the P-well region 5 and the P−-semiconductor layer 14 are present and produces an effect of relieving electric field concentration at the end portion when a reverse bias is applied to the region.

Even if the boron dose is increased up to $8 \times 10^{13}$ ions/cm$^2$, the reduction of the drain saturation current is made small by reducing the overlap length of the first semiconductor region 15 and the gate electrode 9 to 0.5 µm or less. Since the dose can be raised, the parasitic resistance under the N+-source region 6 can be reduced, and the turn-on of the parasitic bipolar transistor can be suppressed further. In other words, by the reduction of the overlap length, the channel resistance is not raised even if the dose of boron is increased. Hence, the reduction of the saturation current can be made small. The overlap length is set so as to be nearly equal to the depth, 0.5 µm, of the peak of the impurity concentration distribution from the surface of the semiconductor layer 14.

Figure 3:
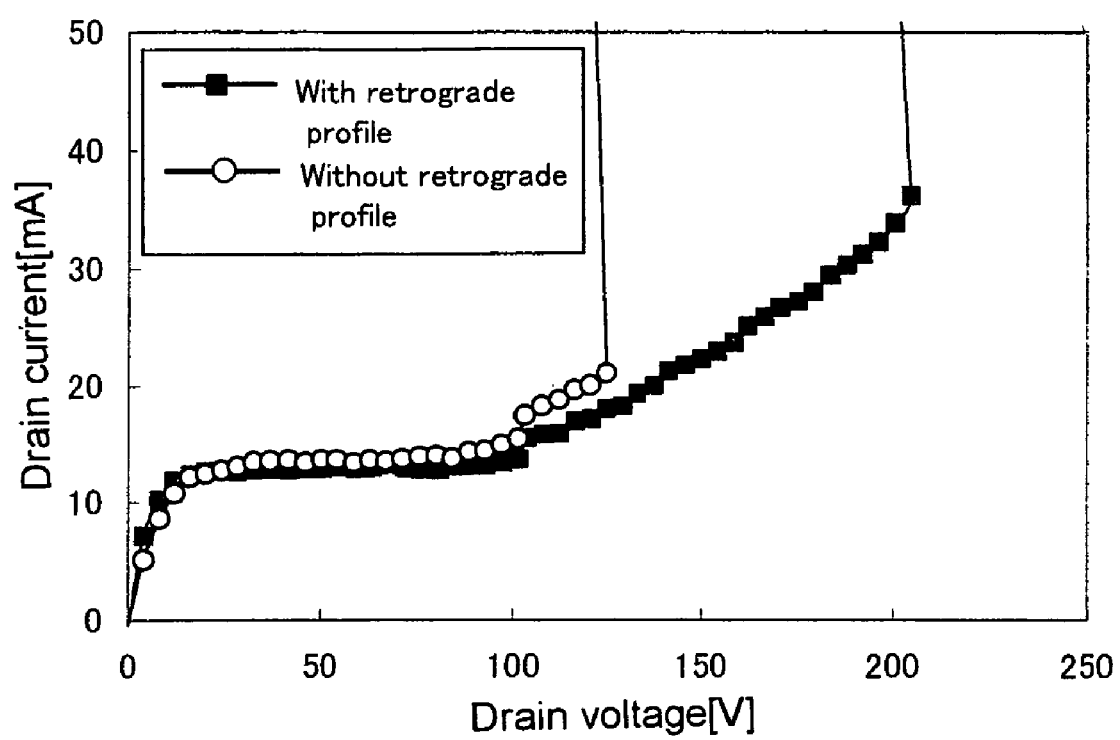
FIG. 3 shows a drain current-voltage characteristic in accordance with the first embodiment of the present invention.

FIG. 3 shows the drain current-voltage of a structure having the retrograde profile of the first semiconductor region 15 as in the case of this embodiment and the drain current-voltage characteristic of a structure having no retrograde profile. In the case that there is no retrograde profile, the breakdown voltage is approximately 130 V. When the retrograde profile is used, the breakdown voltage is increased to approximately 200 V while the drain saturation current is hardly lowered, whereby the on-state breakdown voltage is improved. This is attained since the voltage at which the snap-back phenomenon occurs owing to the turn-on of the parasitic bipolar transistor is raised. This indicates that the present invention is very effective in improving the on-state breakdown voltage and the SOA.

As described above, in this embodiment, the first semiconductor region has a retrograde profile wherein the impurity concentration distribution in the vertical direction increases as the depth from the surface side becomes larger. Furthermore, the first semiconductor region is extended toward the drain side from under the source region to partly under the gate electrode, whereby the reduction of the drain saturation current is suppressed. Hence, the on-state breakdown voltage is raised and the SOA is improved.

Furthermore, the surface concentration in the retrograde profile is set at 5 to 20% of the concentration at the peak, whereby the concentration profile in the vicinity of the surface is made moderate, and the change of Vth is reduced.

A second embodiment in accordance with the present invention will be described below on the basis of FIG. 4.

Figure 4:
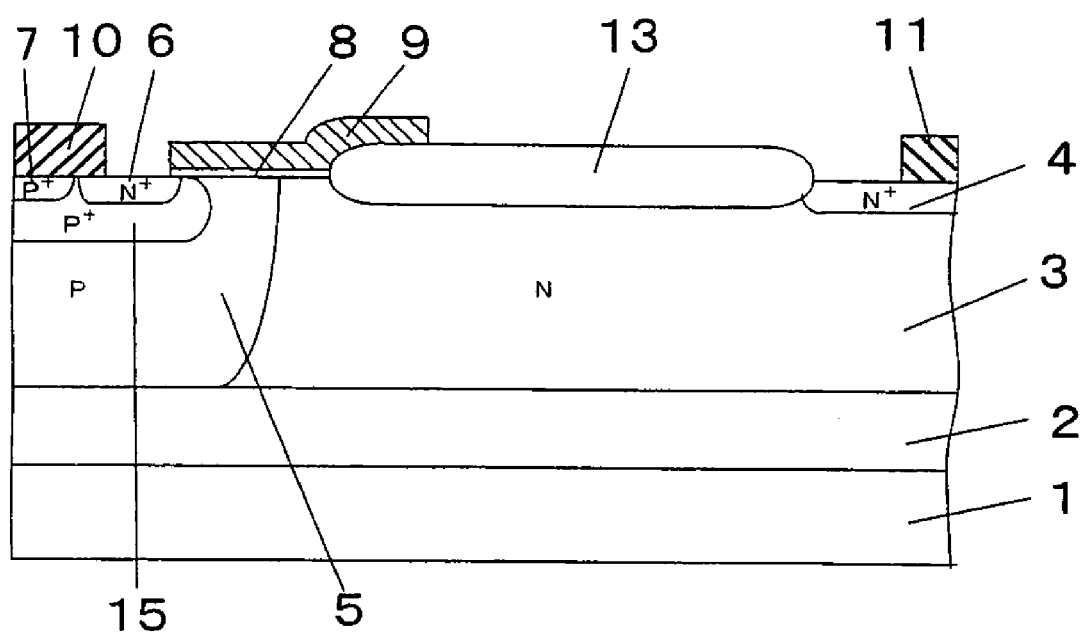
FIG. 4 is a sectional view of a high withstand voltage NMOS transistor in accordance with a second embodiment of the present invention.

FIG. 4 is a sectional view of a high withstand voltage NMOS transistor in accordance with the second embodiment of the present invention.

As shown in FIG. 4, the device has a structure that uses an SOI substrate on which an N-type semiconductor layer 3 is formed. This structure is similar to the device structure shown in FIG. 1, except that the P-well region 5 reaches the buried insulating film 2.

A third embodiment in accordance with the present invention will be described below on the basis of FIG. 5.

Figure 5:
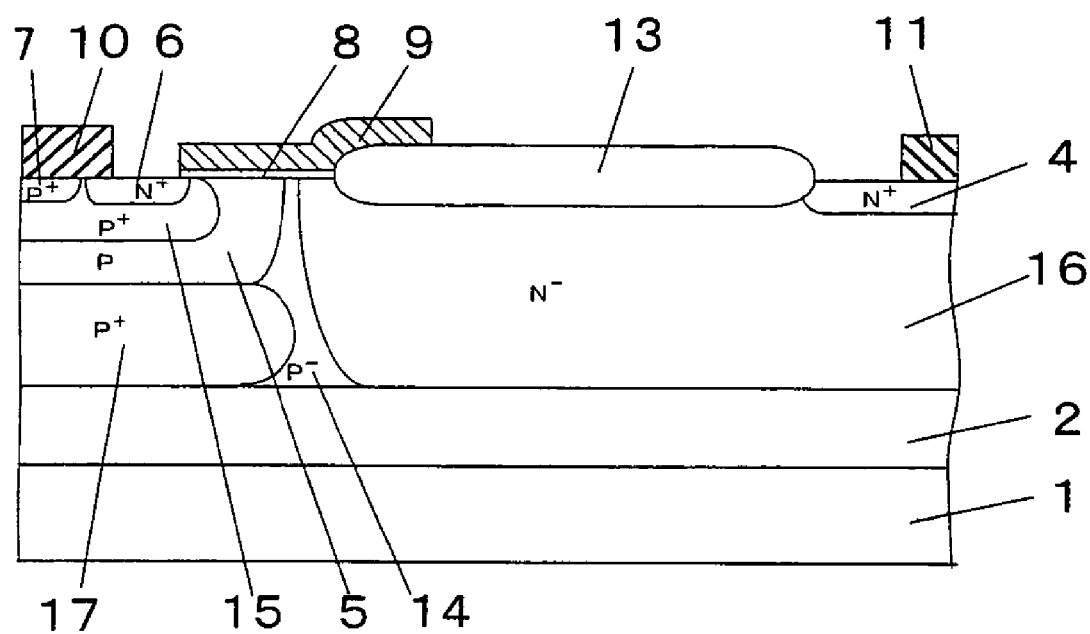
FIG. 5 is a sectional view of a high withstand voltage NMOS transistor in accordance with a third embodiment of the present invention.

FIG. 5 is a sectional view of a high withstand voltage NMOS transistor in accordance with the third embodiment of the present invention.

As shown in FIG. 5, the device has a structure wherein a P+-buried region 17 is formed under the first semiconductor region 15. Since the parasitic resistance of the well region under the N+-source region 6 can be reduced further, the turn-on of the parasitic bipolar transistor can be suppressed further.

A fourth embodiment in accordance with the present invention will be described below on the basis of FIGS. 6 to 8.

Figure 6:
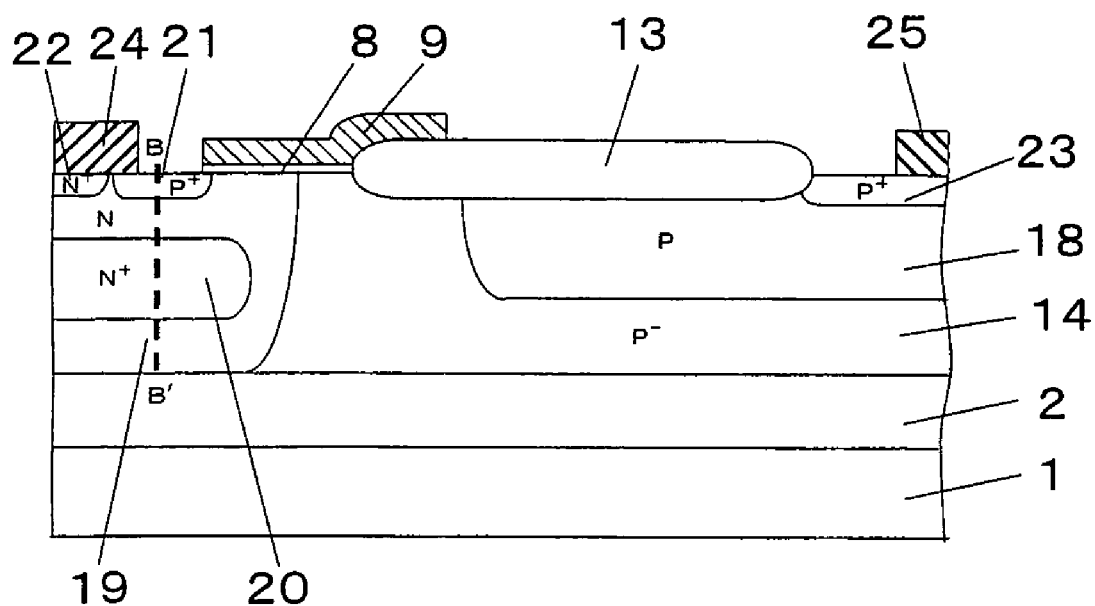
FIG. 6 is a sectional view of a high withstand voltage PMOS transistor in accordance with a fourth embodiment of the present invention.

FIG. 6 is a sectional view of a high withstand voltage PMOS transistor in accordance with the fourth embodiment of the present invention.

As shown in FIG. 6, a support substrate 1 is provided, and above the support substrate 1, a P−-semiconductor layer 14 is formed on a buried insulating film 2. On the surface of the P−-semiconductor layer 14, an N-well region 19 including phosphorus as an impurity and a P-type drift region 18 away from the N-well region 19 are formed. On the surface of the N-well region 19, a P+-source region 21 is formed, and on the surface of the P-type drift region 18, a P+-drain region 23 is formed. Above the region ranging from an end of the P+-source region 21 to an end of the N-well region 19 on the surface of the P−-semiconductor layer 14, a gate electrode 9 is formed on a gate insulating film 8.

Directly under the P+-source region 21 in the N-well region 19, an N+-buried region 20 including antimony or arsenic as an impurity is disposed and extended to the drain side. This configuration is effective in suppressing punch-through between the source and the drain.

Figure 7:
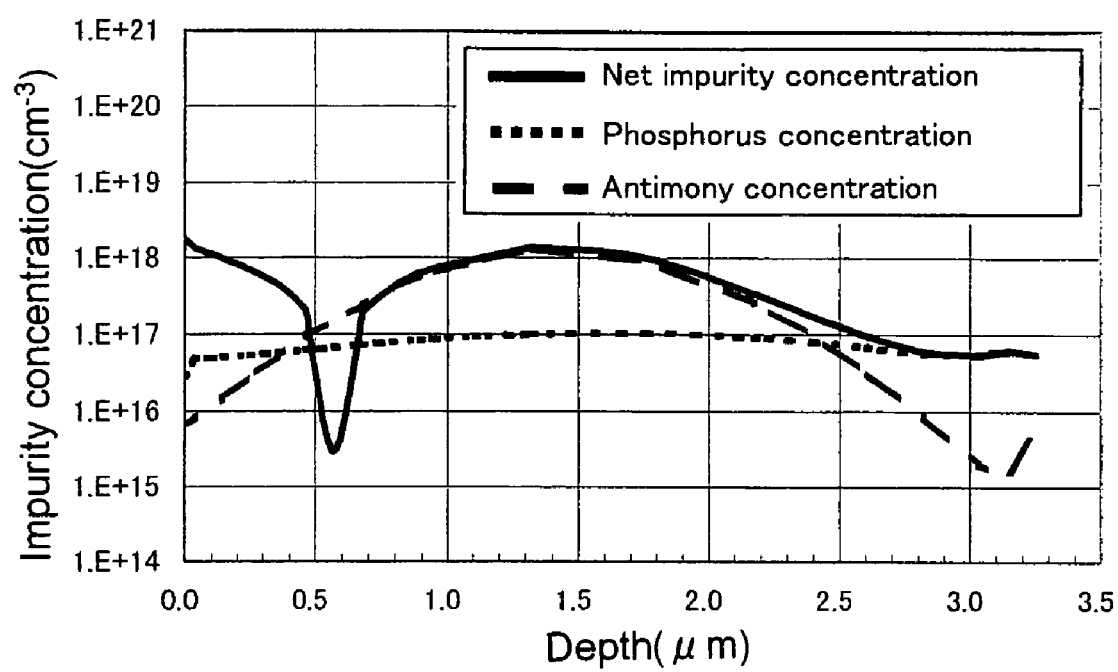
FIG. 7 shows an impurity profile in the vertical direction in the source region in accordance with the fourth embodiment of the present invention.

FIG. 7 shows the impurity concentration profile on line B-B' of FIG. 6. Antimony has a peak concentration of approximately $1 \times 10^{18}$ cm$^{-3}$ at a depth of approximately 1.5 µm. However, its surface concentration is $1 \times 10^{16}$ cm$^{-3}$ or less, a level not affecting the channel region. This is based on the reason that, since the antimony in the buried region 20 has a diffusion constant smaller than that of the phosphorus in the N-well region 19, the antimony cannot reach the channel region even if it is added at a high concentration.

Figure 8:
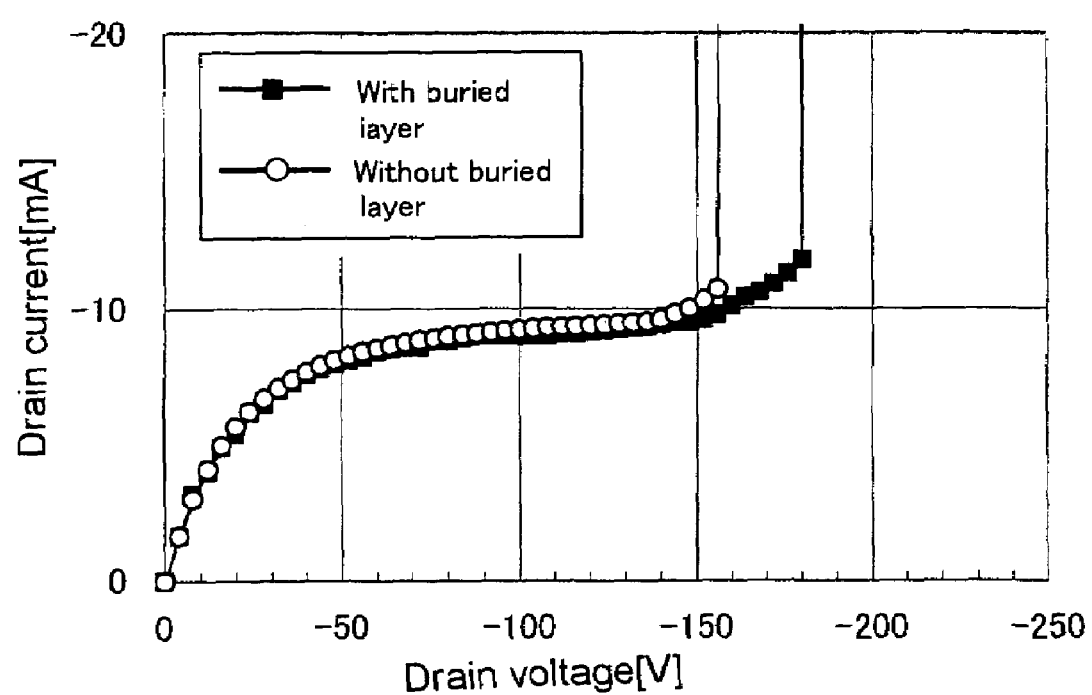
FIG. 8 shows a drain current-voltage characteristic in accordance with the fourth embodiment of the present invention.

FIG. 8 shows a drain current-voltage characteristic depending on whether the N+-buried layer to which antimony is added is present or not. Even when the N+-buried layer is present, the drain saturation current hardly lowers, and the on-state breakdown voltage characteristic is improved.

As described above, with this embodiment, the impurity concentration in the buried diffusion region formed under the source region in the well region can be raised easily without raising the surface concentration. Hence, the turn-on of the parasitic bipolar transistor can be suppressed by reducing the parasitic resistance of the well region, without reducing the drain saturation current. As a result, an excellent drain current-voltage characteristic can be obtained.

A fifth embodiment in accordance with the present invention will be described below on the basis of FIG. 9.

Figure 9:
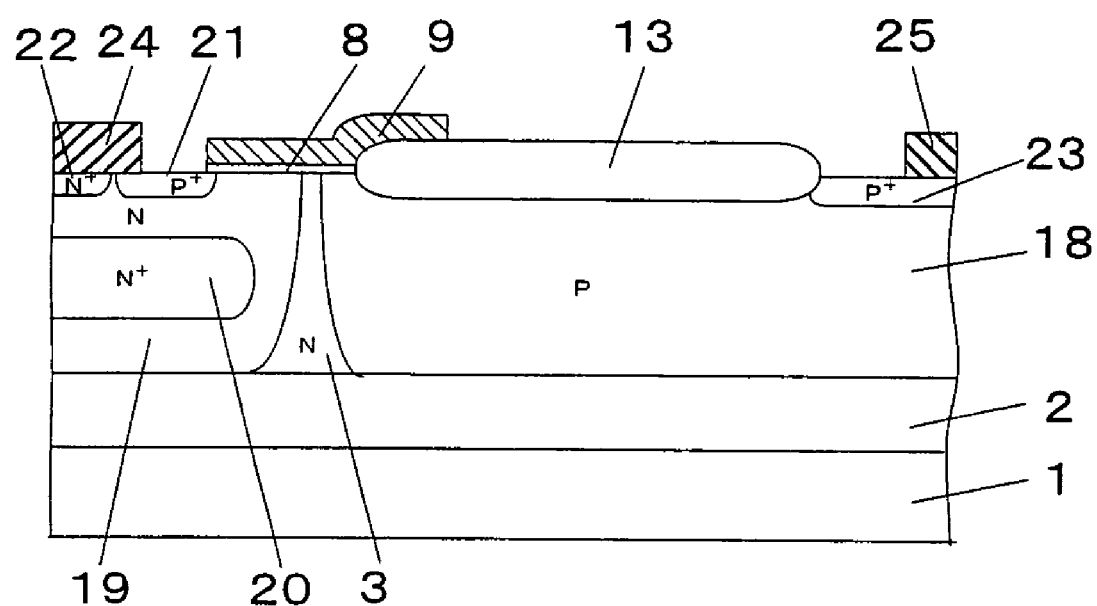
FIG. 9 is a sectional view of a high withstand voltage PMOS transistor in accordance with a fifth embodiment of the present invention.

FIG. 9 is a sectional view of a high withstand voltage PMOS transistor in accordance with the fifth embodiment of the present invention.

As shown in FIG. 9, the device has a structure that uses an SOI substrate on which an N-type semiconductor layer is formed. This structure is similar to the device structure shown in FIG. 6, except that the P-type drift region 18 is extended under the gate electrode.

FIG. 10 shows a method for producing the N-well region 19 and the N+-buried region 20 in accordance with the fourth embodiment and the fifth embodiment. Although the method shown in this figure corresponds to the fourth embodiment, the method is similarly applicable to the fifth embodiment.

Figure 10A:
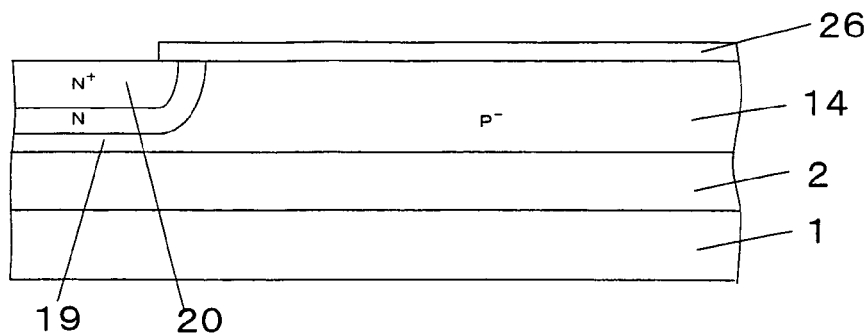
FIG. 10 is a sectional view showing a method for producing an N-well region and an $N^+$-buried region in accordance with the fourth or fifth embodiment of the present invention.
Figure 10B:
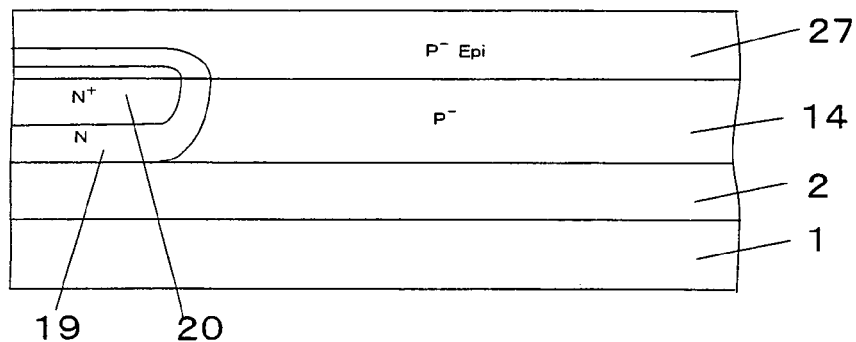
Figure 10C:
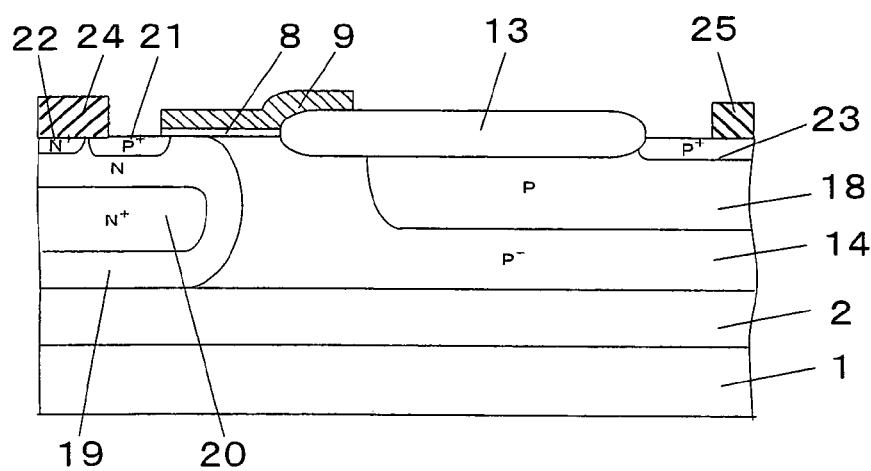
Figure 11:
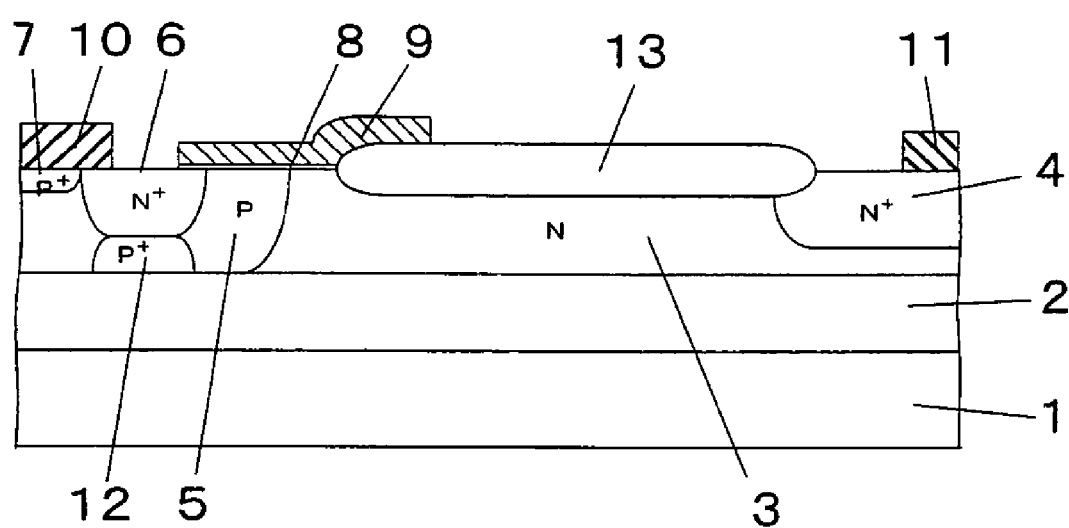
FIG. 11 is a sectional view showing the conventional lateral NMOS transistor.

Referring to FIG. 10A, on the surface of an SOI substrate serving as a semiconductor layer having a thickness of 2.0 μm, a mask layer 26 is formed, and then an N-well region 19 is formed by carrying out ion implantation at a phosphorus dose of $3 \times 10^{13}$ ions/cm$^2$. After this, ion implantation is carried out at a high antimony dose using the same mask layer 26, and then drive-in is carried out. Furthermore, as shown in FIG. 10B, a P-type epitaxial layer 27 is grown to have a thickness of 1.5 μm, whereby the film thickness of the semiconductor layer becomes 3.5 μm. As a result, an N+-buried region 20 is formed. FIG. 10C shows the final sectional structure of the device. The N-well region 19 reaches the surface of the semiconductor layer, whereby a channel region is formed.

As described above, since the ion implantation of antimony and the ion implantation of phosphorus are carried out using the same mask, the mask can be used commonly. Furthermore, even in the buried diffusion region before epitaxial growth, the diffusion constants of the impurities are small. Hence, even if the other diffusion layers are heat-treated, the impurities are not diffused to the channel region near the surface. Sufficiently high concentration can thus be obtained.

The present invention is not limited to the lateral MOS transistors described in the above-mentioned embodiments but applicable to composite devices having a MOS gate, such as a lateral IGBT. In this case, the drain is replaced with a diffusion layer having the conductivity type opposed to that of the MOS transistor. Furthermore, the present invention is effective for lateral transistors having a high withstand voltage of 100 V or more in particular. However, the present invention may also be applied to devices having a relatively low withstand voltage of 100 V or less.

The invention claimed is:

1. A lateral semiconductor device comprising:
   a support substrate,
   a buried insulating film formed on said support substrate,
   a first conductivity type semiconductor layer formed on said buried insulating film,
   a first conductivity type first semiconductor region formed on the surface of said semiconductor layer,
   a second conductivity type second semiconductor region formed in said semiconductor layer so as to be adjacent to or away from said first semiconductor region,
   a second conductivity type source region formed on the surface of said first semiconductor region,
   a second conductivity type drain region formed on the surface of said second semiconductor region,
   a gate insulating film formed between an end of said source region on the surface of said semiconductor layer and an end of said second semiconductor region, and
   a gate electrode formed on said gate insulating film, wherein
   said first semiconductor region is extended from under said source region to partly under said gate electrode, the concentration distribution of a first conductivity type impurity increases in the region ranging from the surface of said semiconductor layer to said buried insulating film and has a peak under said source region, and the impurity concentration in said semiconductor layer ranging from directly under said first semiconductor region to said buried insulating film is lower than the surface concentration in said first semiconductor region.

2. A lateral semiconductor device in accordance with claim 1, wherein an interval is provided between an end of said first semiconductor region and an end of said second semiconductor region.

3. A lateral semiconductor device in accordance with claim 1, wherein the peak of the concentration distribution of the first conductivity type impurity in said first semiconductor region is located at a depth of 0.5 μm or less from the surface of said semiconductor layer.

4. A lateral semiconductor device in accordance with claim 1, wherein the surface concentration of the first conductivity type impurity in said first semiconductor region is in the range of 5 to 20% of said peak concentration.

5. A lateral semiconductor device in accordance with claim 1, wherein a first conductivity type buried region having an impurity concentration higher than that in said semiconductor layer is provided in said semiconductor layer under said first semiconductor region.

6. A lateral semiconductor device in accordance with claim 1, wherein the overlap length of said first semiconductor region and said gate electrode is nearly equal to the depth of the peak of the concentration distribution of the first conductivity type impurity from the surface of said semiconductor layer.

7. A lateral semiconductor device comprising:
   a support substrate,
   a buried insulating film formed on said support substrate,
   a second conductivity type semiconductor layer formed on said buried insulating film,
   a first conductivity type well region formed so as to reach said buried insulating film from the surface of said semiconductor layer,
   a first conductivity type first semiconductor region formed on the surface of said well region, a second conductivity type source region formed on the surface of said first semiconductor region, a second conductivity type drain region formed on the surface of said semiconductor layer so as to be away from said well region, a gate insulating film formed between an end of said source region on the surface of said semiconductor layer and an end of said well region, and a gate electrode formed on said gate insulating film, wherein said first semiconductor region is extended from under said source region to partly under said gate electrode, the concentration distribution of a first conductivity type impurity increases in the region ranging from the surface of said semiconductor layer to said buried insulating film and has a peak under said source region, and the impurity concentration in said well region ranging from directly under said first semiconductor region to said buried insulating film is lower than the surface concentration in said first semiconductor region.

8. A lateral semiconductor device in accordance with claim 7, wherein an interval is provided between an end of said first semiconductor region and an end of said second semiconductor region.

9. A lateral semiconductor device in accordance with claim 7, wherein the peak of the concentration distribution of the first conductivity type impurity in said first semiconductor region is located at a depth of 0.5 μm or less from the surface of said semiconductor layer.

10. A lateral semiconductor device in accordance with claim 7, wherein the surface concentration of the first conductivity type impurity in said first semiconductor region is in the range of 5 to 20% of said peak concentration.

11. A lateral semiconductor device in accordance with claim 7, wherein a first conductivity type buried region having an impurity concentration higher than that in said semiconductor layer is provided in said semiconductor layer under said first semiconductor region.

12. A lateral semiconductor device in accordance with claim 7, wherein the overlap length of said first semiconductor region and said gate electrode is nearly equal to the depth of the peak of the concentration distribution of the first conductivity type impurity from the surface of said semiconductor layer.

13. A lateral semiconductor device comprising:
a support substrate,
a buried insulating film formed on said support substrate,
a first conductivity type semiconductor layer formed on said buried insulating film,
a second conductivity type well region formed on the surface of said semiconductor layer,
a first conductivity type second semiconductor region formed so as to be adjacent to or away from said well region in said semiconductor layer,
a first conductivity type source region formed on the surface of said well region,
a first conductivity type drain region formed on the surface of said second semiconductor region,
a gate insulating film formed between an end of said source region and an end of said well region, and
a gate electrode formed on said gate insulating film, wherein
a second conductivity type buried region is provided in the semiconductor layer under said source region, and the diffusion constant of the second conductivity type impurity in said buried region is smaller than the diffusion constant of the second conductivity type impurity in said well region.

14. A lateral semiconductor device in accordance with claim 13, wherein said buried region is extended from under said source region to the drain side.

15. A lateral semiconductor device in accordance with claim 13, wherein the impurity in said buried region is antimony or arsenic, and the impurity in said well region is phosphorus.

16. A lateral semiconductor device comprising:
a support substrate,
a buried insulating film formed on said support substrate,
a second conductivity type semiconductor layer formed on said buried insulating film,
a second conductivity type well region formed on the surface of said semiconductor layer,
a first conductivity type second semiconductor region formed so as to be adjacent to or away from said well region in said semiconductor layer,
a first conductivity type source region formed on the surface of said well region,
a first conductivity type drain region formed on the surface of said second semiconductor region,
a gate insulating film formed between an end of said source region and an end of said second semiconductor region, and
a gate electrode formed on said gate insulating film, wherein
a second conductivity type buried region is provided in the semiconductor layer under said source region, and the diffusion constant of the second conductivity type impurity in said buried region is smaller than the diffusion constant of the second conductivity type impurity in said well region.

17. A lateral semiconductor device in accordance with claim 16, wherein said buried region is extended from under said source region to the drain side.

18. A lateral semiconductor device in accordance with claim 16, wherein the impurity in said buried region is antimony or arsenic, and the impurity in said well region is phosphorus.

19. A lateral semiconductor device producing method comprising:
a step of forming a mask layer on a first or second conductivity type semiconductor layer formed on buried insulating film over a support substrate,
a step of forming a buried region in said semiconductor layer by carrying out ion implantation of a second conductivity type first impurity using said mask layer as a mask,
a step of carrying out ion implantation of a second impurity having a diffusion constant larger than that of said first impurity using said mask layer as a mask,
a step of eliminating said mask layer and carrying out epitaxial growth on the surface of said semiconductor layer, and
a step of forming a well region by extending said second impurity to the surface of said semiconductor layer by heat treatment.

* * * * *